United States Patent [19]

Nakano et al.

[11] Patent Number: 4,705,911
[45] Date of Patent: Nov. 10, 1987

[54] SOLAR CELL MODULE

[75] Inventors: Akihiko Nakano, Itami; Takeshi Hibino, Ikoma; Hajime Takata, Neyagawa; Manabu Yoshida, Hirakata, all of Japan

[73] Assignee: Matsushita Electric Industrial Co., Ltd., Osaka, Japan

[21] Appl. No.: 939,713

[22] Filed: Dec. 5, 1986

[30] Foreign Application Priority Data

Dec. 5, 1985 [JP] Japan .................................. 60-273722

[51] Int. Cl.$^4$ ............................................. H01L 25/02
[52] U.S. Cl. .................................... 136/251; 136/259; 136/260
[58] Field of Search ........................ 136/251, 259, 260

[56] References Cited

U.S. PATENT DOCUMENTS 4,578,526 3/1986 Nakano et al. ...................... 136/251
4,633,032 12/1986 Oido et al. ........................... 136/251

FOREIGN PATENT DOCUMENTS 57-63866 4/1982 Japan ................................... 136/251
58-215081 12/1983 Japan ................................... 136/251

OTHER PUBLICATIONS

Hiroshi Uda et al., "All Screen Printed CdS/CdTe Solar Cell", *Proceedings of the Sixteenth IEEE Photovoltaic Specialists Conference*, Sep. 1982, pp. 801-804.

*Primary Examiner*—Aaron Weisstuch
*Attorney, Agent, or Firm*—Wenderoth, Lind & Ponack

[57] ABSTRACT

A solar cell module having a CdS/CdTe junction as a photovoltaic portion comprises a glass substrate, a metal foil, a layer of resin bonding the glass substrate and the metal foil together at a peripheral region of the module. For minimizing the reduction in conversion efficiency, an oxygen releasing agent is filled in the space delimited by the glass substrate, the metal foil and the resin layer.

8 Claims, 4 Drawing Figures

SOLAR CELL MODULE

BACKGROUND OF THE INVENTION

1. Field of Technology

The present invention generally relates to a solar cell module and, more particularly, to a package of CdS/CdTe solar cells.

2. Description of the Prior Art

As a source of electric energy, much attention is now centered on solar cells which are inexhaustible and are clean. This is because solar energy is limitless and readily available everywhere on the earth and can be directly converted into electric energy at any convenience. However, solar cells have not yet come into wide use because the cost of electricity available from solar cells is very high. The high cost of electricity is based on the high cost of manufacture of the solar cell as well as that of a module of solar cells. While many efforts have been made to reduce the manufacturing cost of solar cells, it is equally important for efforts to be made to reduce the manufacturing cost of solar cell modules. In addition, with modification in the design of the solar cells, the design of the package must also be modified, or developed, enough to accommodate the modified design of the solar cells.

Most of the prior art solar cell modules have been developed with the aim of being used with crystalline-type solar cells such as single crystal silicon solar cells and polycrystal silicon cells and, therefore, need to be modified in order for them to be useable with thin-film solar cells such as II-VI group compound semiconductor solar cells and amorphous silicon solar cells.

The II-VI group compound semiconductor solar cells include CdS/CdTe solar cells, the basic structure of which is disclosed on pages 801 to 804 of "PROCEEDINGS OF THE SIXTEENTH IEEE PHOTOVOLTAIC SPECIALISTS CONFERENCE", September, 1982. One package of CdS/CdTe solar cells is disclosed in Japanese Laid-open Patent Publication No. 60-32352 (corresponding to U.S. Pat. No. 4,578,526, patented Mar. 25, 1986). Since it was found that CdS/CdTe solar cell have the following peculiar property, it requires a special package structure.

As a CdS/CdTe solar cell module, some of the inventors of the present invention have devised the module having the construction shown in FIG. 3 of the accompanying drawings. The solar cell module shown in FIG. 3 comprises a solar cell element 1 formed on a substrate 6 so as to leave a peripheral margin 20 exteriorly around the solar cell element 1, a protective layer 7 covering the solar cell element 1, a layer of synthetic resin 10 filled in the space between the solar cell element 1 and the protective layer 7, and an electrically insulating film 40 positioned between the solar cell element 1 and the resin layer 10 and held in contact with the solar cell element 1 without being bonded thereto.

Another type of CdS/CdTe solar cell module recently devised is shown in FIG. 4. The solar cell module shown in FIG. 4 is similar to that shown in FIG. 3, but differs therefrom in that no electrically insulating film 40 is employed and a gaseous medium 30, either air or a gas containing oxygen, is filled in a space delimited by the substrate 6, a metal foil 7 and the resin layer 10 bonding the substrate 6 and the metal foil 7 together.

In any of these prior art CdS/CdTe solar cell modules, much care has been taken to avoid any possible entry of a liquid medium, and no consideration has been paid to the influence which oxygen may bring about on the element when fabricated into a module. It has recently been found that oxygen present around the Cd/CdTe solar cell element greatly affects the element at high temperature. More specifically, as shown by Comparison 2 in the Table shown below, it has been found that the reduction in the conversion efficiency during operation at a high temperature without oxygen around the element is very drastic as compared with that with oxygen. The reason for it appears to be that the p-type characteristics of CdTe of the element is reduced in the absence of oxygen.

The solar cell module shown in FIG. 4 is an improved version of the solar cell module of FIG. 3 wherein attempts have been made to obviate the above discussed problem. Since in the solar cell module of FIG. 4, the gaseous medium containing oxygen is in contact with the CdS/CdTe solar cell element, the oxygen participates in lessening the speed of reduction of the conversion efficiency, but at high temperature the oxygen tends to become diminished and, therefore, the reduction in conversion efficiency is still marked.

SUMMARY OF THE INVENTION

The present invention has been developed with a view to solving the problem in that the conversion efficiency decreases without oxygen and has for its object to provide an improved CdS/CdTe solar cell module comprising a CdS/CdTe junction as a photovoltaic portion, wherein an oxygen releasing agent such as, for example, peroxide is provided so as to minimize the reduction in the p-type characteristics of the CdTe.

Peroxide, one of the oxygen releasing agents useable in the practice of the present invention, is known as having not only the property of being abruptly, or occasionally explosively, decomposed when heated to the decomposition temperature, but also the property of being decomposed progressively with change in temperature even when heated to a temperature lower than the decomposition temperature. Accordingly, if the peroxide is placed around and in the vicinity of a portion where the CdS/CdTe solar cell element is formed, oxygen released from the peroxide as a result of the decomposition can be supplied to minimize the reduction in conversion efficiency which would result from the shortage of oxygen.

BRIEF DESCRIPTION OF THE DRAWINGS

This and other objects and features of the present invention will become understood from the following description of preferred embodiments thereof taken with reference to the accompanying drawings, in which.

DETAILED DESCRIPTION OF THE EMBODIMENTS

Figure 1:
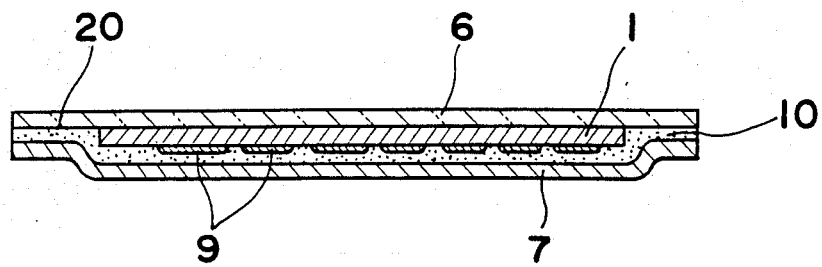
FIGS. 1 and 2 are sectional views of solar cell modules according to different preferred embodiments of the present invention, respectively.

Before the description of the present invention proceeds, it is to be noted that like parts are designated by like reference numerals throughout all of the accompanying drawings.

EXAMPLE 1

Referring now to FIG. 1, a solar cell element 1 is formed directly on a substrate 6 (i.e., on an undersurface thereof as viewed in FIG. 1) so as to leave a peripheral margin 20 exteriorly around such solar cell element 1. A layer 10 of synthetic resin covers both the solar cell element 1 and the peripheral margin 20 of the substrate 6 while sandwiching peroxide 9, i.e., an oxygen releasing agent, between it and the solar cell element 1. A protective layer 7 covers the resin layer 10 with its peripheral edge portion bonded to the peripheral margin 20 of the substrate 6.

The solar cell element 1 was formed by depositing a layer of CdS on an alkali-free borosilicate glass of 14×14 cm in size (for the substrate 6) so as to leave the peripheral margin of 6.5 mm in width, then depositing a layer of CdTe over the CdS layer except for Ag-In electrode regions, depositing a layer of carbon over the CdTe layer, and finally forming Ag electrodes. Ag-In electrodes were formed on the regions where no CdTe layer was deposited. The assembly was thereafter covered by the layer of epoxy resin.

As the resin layer 10, polyethylene modified by copolymerizing acid anhydride was used, and the protective layer 7 was made of an aluminum foil. In the module so made the peripheral edge portion of the protective layer 7 was firmly bonded to the peripheral margin 20 of the glass substrate 6. The peroxide used was ammonium persulfate and was employed in the form of a plurality of small blocks and placed over the element 1. The total weight of ammonium persulfate was about 0.3 g.

The result of the test conducted to determine the reliability at 100° C. of the solar cell module fabricated in the manner as hereinbefore described is tabulated in the Table below.

TABLE

| Results of Test (at 100° C. for 500 hours) | | |
| --- | --- | --- |
| | Oxygen Releasing Agent | Change in Conversion Efficiency (%) |
| Exam. 1 | Ammonium persulfate | −4 |
| 2 | Calcium peroxide | −5 |
| 3 | Zinc peroxide | −6 |
| 4 | Magnesium peroxide | −7 |
| 5 | Ammonium persulfate + Air | −3 |
| Comp. 1 | None | −25 |
| Comp. 2 | Oxygen Absorbent (Iron Powder) | −41 |

For the purpose of comparison, the reliability test results of the solar cell modules without oxygen releasing agent and with oxygen absorbent used in the form of iron powder, are also listed and designated by Comp. 1 and Comp. 2, respectively.

EXAMPLE 2

The solar cell module of the same structure as that in Example 1, but wherein calcium peroxide was used in place of ammonium persulfate, was tested as to the reliability, the result of which is tabulated in the Table.

EXAMPLE 3

The solar cell module of the same structure as that in Example 1, but wherein zinc peroxide was used in place of ammonium persulfate, was similarly tested, the result of which is tabulated in the Table.

EXAMPLE 4

The solar cell module of the same structure as that in Example 1, but wherein magnesium peroxide was used in place of ammonium persulfate, was similarly tested, the result of which is tabulated in the Table.

EXAMPLE 5

Figure 2:
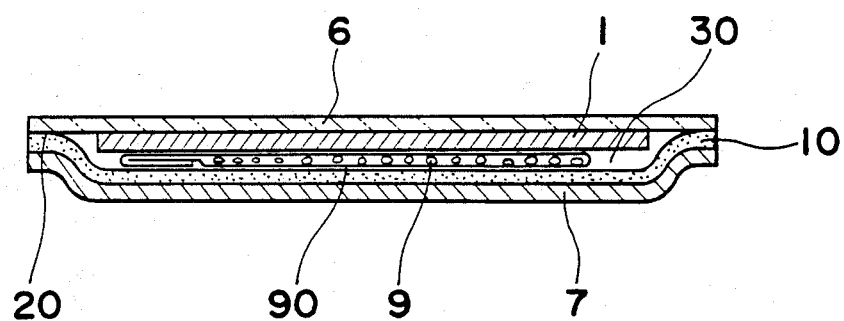
Figure 3:
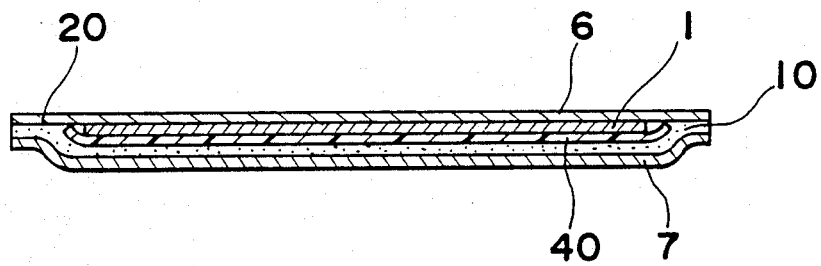
FIGS. 3 and 4 are views similar to any one of FIGS. 1 and 2, showing the prior art solar cell modules, reference to which has been made.
Figure 4:
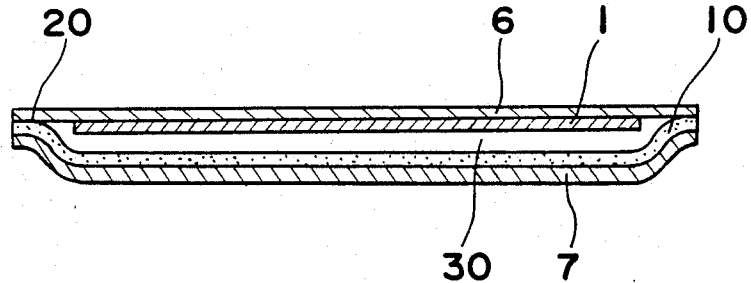

The solar cell module similar in structure to that in Example 1, but differing therefrom in that, as shown in FIG. 2, a single polyethylene bag 90 filled with 0.3 g of ammonium persulfate 9 and air 30 to an average thickness of about 1 mm and having its mouth left opened was employed and filled in a space delimited by the protective layer 7, the substrate 6 and the resin layer 10. The solar cell module was also tested as to its reliability.

From the Table, it is clear that the use of the ammonium persulfate filled in the bag with air such as in Example 5 has exhibited the smallest reduction in conversion efficiency of all listed therein. This appears to have resulted from the fact that not only did oxygen contained in the air participate in the minimization of the reduction in conversion efficiency to some extent, but also moisture contained in the same air has accelerated the decomposition of the ammonium persulfate to release oxygen therefrom which has in turn further minimized the reduction in conversion efficiency.

It is also clear that, although Example 4 has exhibited the greatest reduction in conversion efficiency of all of the Examples according to the present invention, it is still far smaller than the reduction exhibited by Comparison 1.

Considering that the use of iron powder which absorbs oxygen such as in Comparison 2 has exhibited the greatest reduction in conversion efficiency of all listed in the Table, the presence of oxygen is obviously important in minimizing the reduction in conversion efficiency of the solar cell module. Therefore, the use of the oxygen releasing agent according to the present invention in the solar cell module has brought about a meritorious effect, minimizing the reduction in performance of the solar cell module, particularly when the latter is used under a high temperature environment.

Although the present invention has been described in connection with the preferred embodiments thereof, various changes and modifications are apparent to those skilled in the art. By way of example, although reference has been made to the use of peroxide as the oxygen releasing agent which releases oxygen when decomposed, any substance or composition may be used for the oxygen releasing agent, which, although it contains oxygen in an adsorbed or occluded form, progressively releases oxygen under a condition in which the solar cell module is used may be employed. Any composition which, when reacted with one or more substances, releases oxygen may also be used as the oxygen releasing agent.

Moreover, for filling the oxygen releasing agent in the solar cell module, the use of a bag or bags has been made in the foregoing embodiments. However, the use of a bag or bags may not be always essential, and in this case, the oxygen releasing agent may be mixed with the resin, or may be in the form of pellets. When the bag or bags are used, the material therefor may not be limited to polyethylene.

Yet, the position of the oxygen releasing agent within the solar cell module may be where it contacts the CdS/CdTe element either directly or through the intervention of a resinous film. Where the resinous film is intervened, it may happen that, during the accelerated test as to the reliability at the elevated temperature, the penetration of the released oxygen through the film if the latter has a substantial thickness requires a relatively long time, and therefore, in this case, the resinous film should be perforated.

Such changes and modifications are, accordingly, to be understood as included within the scope of the present invention as defined by the appended claims, unless they depart therefrom.

What is claimed is:

1. A solar cell module comprising a CdS/CdTe junction as a photovoltaic portion and an oxygen releasing agent filled in the module.

2. The module is claimed in claim 1, wherein the oxygen releasing agent is peroxide.

3. The module as claimed in claim 2, wherein the oxygen releasing agent is at least one selected from the group consisting of ammonium persulfate, calcium peroxide, zinc peroxide, and magnesium peroxide.

4. The module as claimed in claim 1, wherein the oxygen releasing agent is contained in at least one polyethylene bag, the bag with the oxygen releasing agent being filled in the space without its mouth closed.

5. A solar cell module having a CdS/CdTe junction as a photovoltaic portion, which module comprises a glass substrate, a metal foil, a layer of resin bonding the glass substrate and the metal foil together, and an oxygen releasing agent filled in the space delimited by the glass substrate, the metal foil, and the resin layer.

6. The module as claimed in claim 5, wherein the resin layer comprises polyethylene modified by copolymerizing acid anhydride.

7. A solar cell module having a CdS/CdTe junction as a photovoltaic portion, which module comprises a glass substrate, a metal foil, a layer of resin bonding the glass substrate and the metal foil together, and an oxygen releasing agent filled together with air or a gaseous medium containing oxygen, in the space delimited by the glass substrate, the metal foil, and the resin layer.

8. The module as claimed in claim 4, wherein the resin layer comprises polyethylene modified by copolymerizing acid anhydride.

* * * * *